United States Patent [19]

Kluth

[11] Patent Number: 5,438,689
[45] Date of Patent: Aug. 1, 1995

[54] RADIO RECEIVER FOR A VEHICLE HAVING IMPROVED AUDIBILITY FOR SPEACH

[75] Inventor: Hans-Jurgen Kluth, VS-Villingen, Germany

[73] Assignee: Deutsche Thomson Brandt GmbH, Villingen-Schwenningen, Germany

[21] Appl. No.: 585,111

[22] PCT Filed: Feb. 15, 1989

[86] PCT No.: PCT/EP89/00136
§ 371 Date: Aug. 24, 1992
§ 102(e) Date: Aug. 24, 1992

[87] PCT Pub. No.: WO89/07860
PCT Pub. Date: Aug. 24, 1989

[30] Foreign Application Priority Data

Feb. 22, 1988 [DE] Germany .................. 38 05 457.4

[51] Int. Cl.$^6$ ................................ H04B 1/16
[52] U.S. Cl. ........................ 455/267; 381/86; 455/345; 455/355; 455/228
[58] Field of Search ............ 455/38.2, 38.1, 58.1, 455/70, 99, 267, 344, 345, 352, 353, 355, 99, 228, 200.1; 381/101, 102, 86, 98, 103, 107, 105

[56] References Cited

U.S. PATENT DOCUMENTS

| | | | |
|---|---|---|---|
| 4,238,778 | 12/1980 | Ohsumi | 455/99 |
| 4,363,001 | 12/1982 | Suzuki et al. | 381/101 |
| 4,466,118 | 8/1984 | Dressler | 455/267 |
| 4,686,707 | 8/1987 | Iwasaki et al. | 455/70 |

*Primary Examiner*—James L. Dwyer
*Assistant Examiner*—Philip J. Sobutka
*Attorney, Agent, or Firm*—J. S. Tripoli; P. M. Emanuel; F. A. Wein

[57] ABSTRACT

A radio receiver having switching-over to traffic announcement wherein the bass and treble frequency responses and the volume are changed to a value which is subjectively optimum for the respective actual driver and the announcement becomes more pleasant and easier to understand for him/her without the necessity for the driver to manually change the bass and treble controls. The switching-over of the bass and treble audio frequencies preferably occurs a short time before the switching-over of the announcement. Additionally, further switchings-over can be carried out which are advantageous for the attention of the driver. For example, switching off acoustically disturbing devices such as fans.

5 Claims, 1 Drawing Sheet

RADIO RECEIVER FOR A VEHICLE HAVING IMPROVED AUDIBILITY FOR SPEACH

BACKGROUND

Certain FM radio stations at certain times, or for certain occasions, transmit traffic announcements (road messages) in order to notify drivers of automobiles of congestions, handicaps, detours or points of danger. With an ARI system, it is known to use a pilot signal transmitted from the station to switch on an otherwise switched-off receiver, to switch-off a playing cassette, or to switch over, and in particular, to increase from the actual volume level to a value of volume which is optimum for clear audibility, so that, for example, the driver will have his/her attention drawn to and will not miss the traffic announcement, even with relatively low music volume.

Practical experience has shown that immediately after the switching-over, the traffic announcement is perceived by the driver as unpleasant, is often difficult to understand for acoustic reasons, and may even startle the driver through its suddenly increased volume.

It is the object of the present invention to design a radio receiver for a vehicle in such a way that the spoken announcement is perceived in a subjectively more pleasant way and has improved audibility after the switching-over.

The present invention is based on the following understanding: These days, vehicles such as cars are equipped to an increasing extent with high quality HI-FI radio systems with a stereo cassette player and a multiplicity of loudspeakers. This makes it possible to perform a pleasant HI-FI audio reproduction through respective increasing (emphasizing) of bass and treble which is usually perceived as pleasant. However, for the reproduction of speech, this adjustment is usually less advantageous, especially due to the strongly emphasized bass frequencies. The speech then often sounds dull and can become unintelligible. Now, according to the present invention, on switching-over to traffic announcement, the bass and treble frequencies are also changed, through switching-over the frequency response, to a value which is more subjectively optimum for the respective actual driver and the announcement becomes more pleasant and easier to understand for him/her. It will then no longer be necessary for the driver to manually turn down bass and treble controls. Thus the present invention results in a more pleasant traffic announcement for the driver and an increase in road safety.

The invention-type switching-over of the bass and treble audio frequencies preferably occurs a short time before the switching-over, particularly the increase in volume, for example, in the range of 10 ms in advance. This helps to avoid that the reproduction of the traffic announcement is still unpleasant at the beginning and a crackling noises appear. If desired, along with the above switching-over, further switchings-over in the vehicle can be carried out which are advantageous for the attention of the driver. For example, switching off acoustically disturbing devices such as fans. It may also be useful to switch off the rear loudspeakers in a car upon the switching-over because then the information presented is mainly aimed at the driver and the main objective is clear audibility rather than HI-FI reproduction.

Subsequently, the invention is illustrated by means of the drawing using an exemplary embodiment.

SUMMARY OF THE INVENTION

Briefly, the present invention is for a radio receiver having switching-over to a traffic announcement mode wherein the bass and treble frequency responses and the volume are changed to a value which is subjectively optimum for the respective actual driver, and the announcement becomes more pleasant and easier to understand for him/her without the necessity for the driver to manually change the bass and treble controls. The switching-over of the bass and treble audio frequencies preferably occurs a short time before the switching-over of the announcement. Additionally, further switchings-over can be carried out which are advantageous for the improved attention of the driver. For example, switching off acoustically disturbing devices such as fans.

DETAILED DESCRIPTION OF THE PREFERRED EMBODIMENT

Figure 1:
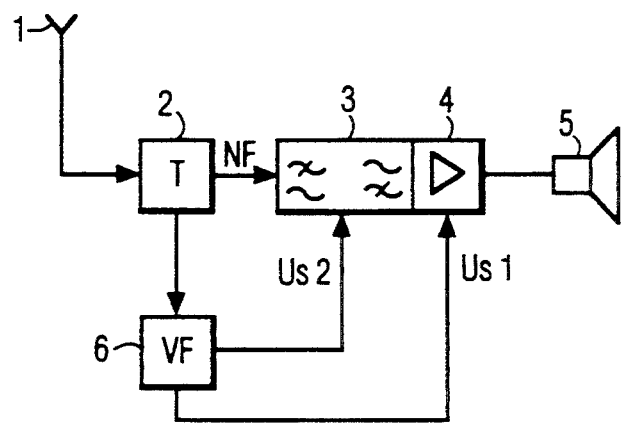
FIG. 1 shows a block circuit diagram of the receiver according to the present invention.

FIG. 1 shows a receiver for an automobile. The FM signal received by means of the aerial 1 reaches the tuner 2 which supplies the NF audio signal for the sound reproduction. The audio signal reaches the loudspeaker 5 via the tone control circuit 3 for emphasizing the bass and treble frequencies and the output amplifier 4. The signal from the tuner 2 also reaches the traffic radio decoder 6. Decoder 6 recognizes a pilot signal which is transmitted by the station during a traffic announcement and supplies a corrective value Us1 which in the amplifier 4 increases the level of volume to a pre-adjusted value and, if desired, switches off other disturbing noise producing devices such as cassette players or fans.

Decoder 6 also generates the switching voltage Us2 which in the circuit 3 switches over the bass and treble adjustments to values which are optimum for a pure oral speech signal. These values can preferably be adjusted because, as a matter of experience, the optimum audio frequency response for an optimum audibility of speech is highly dependent upon the individual.

Figure 2:
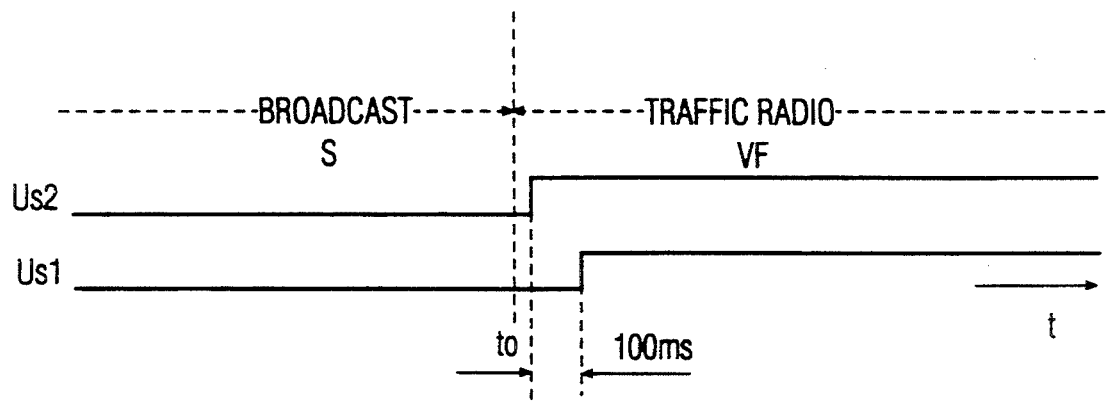
FIG. 2 shows a timing chart for illustrating the operation of the receiver of FIG. 1.

FIG. 2 shows an exemplary temporal process of the two switching voltages Us1 and Us2 which indicate the beginning of a traffic radio announcement (VF). The switching-over from a normal radio broadcast S to traffic radio announcement VF occurs at a particular time. Shortly thereafter the switching voltage Us2 appears and switches the bass and/or treble frequencies (tone) over to values optimum for the audibility of speech. Approximately 100 ms later the switching voltage Us1 appears and switches the volume over to a firmly adjusted value optimum for the audibility. This value is basically dependent on the size of the automobile, the engine noise, and the driving noise. The time order for the switching-over of the volume and tone are interchangeable, or can be accomplished simultaneously.

Figure 3:
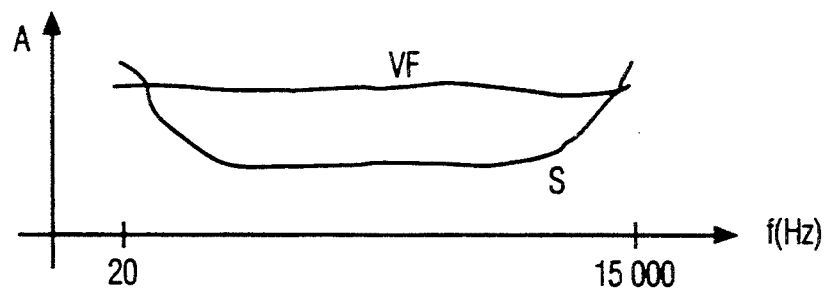
FIG. 3 shows the audio frequency response for the operation of the receiver of FIG. 1 in the two operational modes.

FIG. 3 shows the different frequency responses with normal broadcasts S and radio announcements VF. In a broadcast or with cassette reproduction, the frequency response is usually emphasized in favor of low frequencies and high frequencies because this produces a subjectively more pleasant reproduction, e.g., for music. With the traffic radio announcement, however, the volume is increased through the switching voltage Us1. The frequency response is switched over to an approximately flat frequency response through the entire audible frequency range.

I claim:

1. A radio receiver for a vehicle having audio volume control, and bass and treble tone controls, the radio receiver comprising:
   means for switching-over of the audio volume to a preset value in response to an identification signal transmitted in connection with a traffic radio announcement, and
   means for switching-over the tone control settings to a preset value in response to the identification signal transmitted in connection with the traffic radio announcement, said means for switching-over the tone control settings including means for the tone control switch-over being accomplished prior in time to the volume switch-over.

2. The receiver according to claim 1 wherein during the switching-over, disturbing noise and interfering sources external of the receiver are switched off.

3. A radio receiver for a vehicle having audio volume control, and bass and treble tone controls, the radio receiver comprising:
   means for switching-over of the audio volume to a preset value in response to an identification signal transmitted in connection with a traffic radio announcement, and
   means for switching-over the tone control settings to a preset value in response to the identification signal transmitted in connection with the traffic radio announcement, the switched-over tone settings being essentially a flat frequency characteristic, said means for switching over the tone control setting including means for switching-over the tone frequencies a short time before the switching-over of the volume.

4. The receiver according to claim 3 wherein the car rear loudspeakers are switched off with the switching-over.

5. A radio receiver for a vehicle having audio volume control, and bass and treble tone controls, the radio receiver comprising:
   means for switching-over the audio volume to a preset value in response to an identification signal transmitted in connection with a traffic radio announcement, and
   means for switching-over the bass and treble tone control settings to a preset value in response to the identification signal transmitted in connection with the traffic radio announcement, the bass and treble tone control switch-over being accomplished prior in time to the volume switch over, a car rear loudspeakers being switched off with the switching-over.

* * * * *